United States Patent [19]
Finn et al.

[11] Patent Number: 5,338,913
[45] Date of Patent: Aug. 16, 1994

[54] ELECTRON BEAM GUN WITH LIQUID COOLED ROTATABLE CRUCIBLE

[75] Inventors: Peter W. Finn, Fremont; Larry F. Willitzer, Rodeo, both of Calif.; Karl-Heinz Maurer, Nuertingen, Fed. Rep. of Germany

[73] Assignee: TFI Telemark, Fremont, Calif.

[21] Appl. No.: 997,596

[22] Filed: Dec. 28, 1992

[51] Int. Cl.⁵ ............................................ B23K 15/00
[52] U.S. Cl. ......................... 219/121.16; 219/121.33; 373/13
[58] Field of Search .................. 219/121.17, 121.16, 219/121.33; 373/11, 13

[56] References Cited
U.S. PATENT DOCUMENTS

| | | | |
|---|---|---|---|
| 4,115,653 | 9/1978 | Kienel et al. | 373/11 |
| 4,728,772 | 3/1988 | Smith | 373/11 |

Primary Examiner—C. L. Albritton
Attorney, Agent, or Firm—George C. Limbach

[57] ABSTRACT

An electron beam gun with liquid cooled rotatable crucible is disclosed including a metallic bellows connected to the housing for the rotatable crucible at a 90° angle and the bellows contractible to a minimum length that is a straight line between the axis of the housing and the remote end of the bellows with the bellows permitting rotation about the housing axis as the crucible is rotated to place different pockets in target position of the E-gun.

9 Claims, 3 Drawing Sheets

+0°

+30°

+150°

ELECTRON BEAM GUN WITH LIQUID COOLED ROTATABLE CRUCIBLE

The present invention relates to a liquid cooled rotatable crucible for an electron beam gun (E-gun).

BACKGROUND OF THE INVENTION

E-guns are used for various applications and particularly for vapor deposition processes. Such deposition systems typically include an electron emitting source, a crucible for holding the evaporant, and means for directing the electron beam onto the surface of the evaporant. U.S. Pat. Nos. 3,710,072 and 5,111,022 show various details of prior art E-guns.

Multi-pocket E-guns provide a plurality of pockets in a crucible whereby the crucible can be rotated to place a different one of the pockets in the position at which the electron beam is focused. A multi-pocket E-gun is described in U.S. Pat. No. 4,983,806. Typically an E-gun crucible is liquid cooled, such as with water, and in the rotatable crucible E-guns the water is conveyed to the crucible through lines which include a rotatable seal at the air/vacuum interface. These vacuum seals often use O-ring seals which cause outgassing and/or low level vacuum leaks which present serious problems when very high level vacuum deposition processes are used such as in molecular beam epitaxial processing where the vacuum may be on the order of $1 \times 10^{-11}$ to $1 \times 10^{-12}$ mm of Hg.

One present attempt to provide the appropriate high vacuum seal is to provide metallic, liquid inlet and outlet tubes to the crucible with the tubes aligned parallel to the rotational axis of the crucible and with a flexible portion, such as a bellows, along the length of the tube so that as the crucible is rotated to place the different pockets in desired position the liquid tubes can rotate around the rotational axis and twist along their length at the bellows. This structure results in extensive stress to the bellows when the liquid lines are twisted and increases the possibility of a failure in the bellows which can bring the system up to atmosphere and more importantly, dump liquid coolant into the vacuum chamber.

The object of the present invention is to provide a liquid cooling system for E-guns which insures maintenance of a high vacuum seal while permitting rotation of the liquid cooled rotatable crucible structure of the E-gun assembly.

SUMMARY OF THE INVENTION

Broadly stated the present invention is directed to an E-gun assembly which includes a crucible and crucible support structure rotatable about an axis and a vacuum tight housing extending at an angle to the rotational axis and passing inlet and outlet flexible cooling tubes which are connected to the crucible support structure and wherein the housing includes an elongated metallic bellows which varies in length as the crucible rotates.

One feature and advantage of the present invention is the provision of a metallic vacuum tight structure which enables the cooling fluid to be conveyed to the crucible in separate tubes therein avoiding vacuum leaks or outgassing into the vacuum or subject to dispensing cooling liquid into the electron beam chamber upon any rupture of the housing.

In accordance with another aspect of the present invention the metallic bellows collapses to the minimum length for each position of the crucible structure as the crucible is rotated. In accordance with this aspect of the present invention the potential for rupture of the housing is minimized as the crucible is rotated.

In accordance with another aspect of the present invention a first housing is positioned on the rotatable axis of the crucible and a second housing is provided at an angle to the first housing, preferably at a 90° angle, and is fixedly connected to the first housing so that inlet and outlet flexible nonmetallic crucible cooling tubes are positioned within the first and second housings and connected to the crucible support structure.

These features and advantages of the present invention will become more apparent upon a perusal of the following specification taken in conjunction with the accompanying drawings wherein similar characters of reference refer to similar elements in each of the several views.

DETAILED DESCRIPTION OF THE PREFERRED EMBODIMENT

Figure 1:
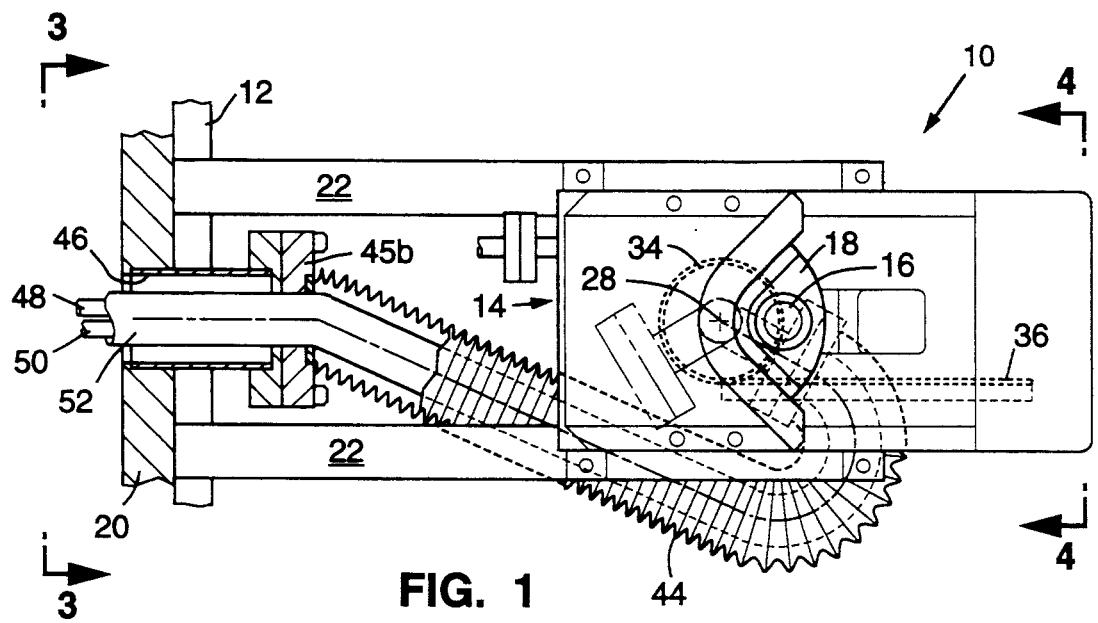
FIG. 1 is a plan view of an E-gun assembly in a vacuum chamber and employing the present invention and with the bellows in extended position.
Figure 2:
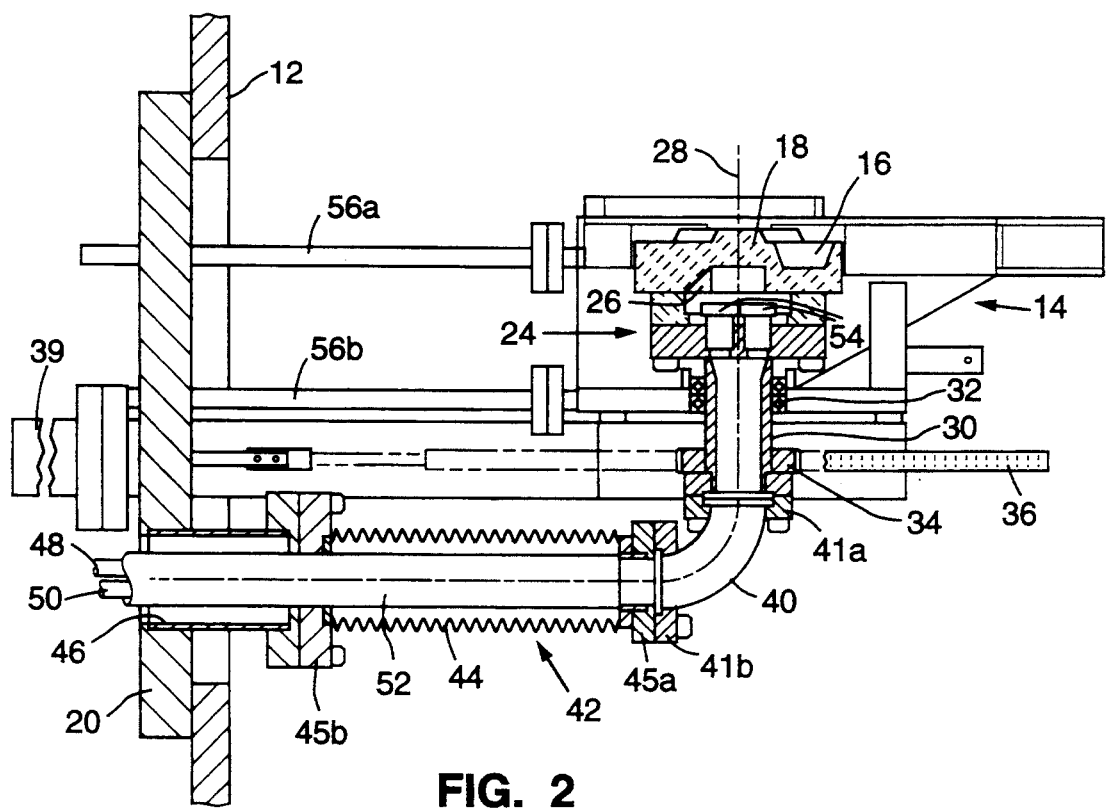
FIG. 2 is an elevational sectional view showing the E-gun assembly of FIG. 1 and with the bellows in fully retracted position.

Referring now to the drawing with particular reference to FIGS. 1–4, there is shown an E-gun assembly 10 for mounting on the wall of a vacuum chamber 12 and having a main body 14 supporting an electron beam gun focused for melting and evaporation of substances in a pocket 16 of a rotatable crucible 18. The crucible illustrated herein has six pockets 16 circumferentially spaced therearound but could have another number such as four or eight. The main body 14 is supported by a pair of support brackets 22 from a vacuum chamber mounted support plate 20.

The crucible 18 is fixedly mounted on a crucible support assembly 24 which in conjunction with the crucible 18 define a cooling liquid chamber 26 therewithin. The crucible support assembly 24 is rotatable about a vertical axis 28 by a hollow cylindrical support housing 30 rotatably mounted via bearings 32 on the main body 14. The crucible 18 and crucible support assembly 24 are rotatable via a pinion 34 mounted on the hollow cylindrical support housing 30 and driven by a rack 36 operated by a control shaft 38 which passes through the vacuum support plate 20 to a drive operation cylinder 39 for actuation by a linear drive, not shown.

On the lower end of the hollow cylindrical support housing 30 one end of a 90° elbow connection housing 40 is connected by a flange 41a and metal gasket, and the other end of the elbow housing connection 40 is secured via a flange 41b and metal gasket to one end of an elongate metallic housing 42 for providing a hollow vacuum tight passage from the support plate 20 to the elbow connection 40 and thence to the chamber 26 for passing water coolant inlet and outlet tubes 48 and 50 for cooling the crucible 18. The housing 42 includes an elongate metal bellows 44 such as of stainless steel which is provided with an end connecting flange 45a for connection at one end to the elbow connection 40 and an end connection flange 45b for connection at the other end to a hollow cylindrical feedthrough cylinder 46 vacuum sealed to the vacuum support plate 20.

The inlet and outlet flexible nonmetallic water tubes 48 and 50, such as of fluorocarbon rubber, such as VITON brand sold by E. I. DuPont and which may be housed in a sheath 52, pass from outside the vacuum chamber 12 through cylinder 46, bellows 44, elbow housing connection 40 and the support housing 30 for connection to fittings 54 in the cooling liquid chamber 26.

The water cooling tubes 48 and 50 and housings 30, 40 and 42 permit regulated flow of cooling fluid from outside the vacuum chamber 12 to the crucible 18 within a fully vacuum tight metal housing avoiding any leaks or outgassing to achieve a high vacuum such as on the order of $1 \times 10^{-11}$ and $1 \times 10^{-12}$ mm of Hg for vapor deposition processes and the like.

Figure 3:
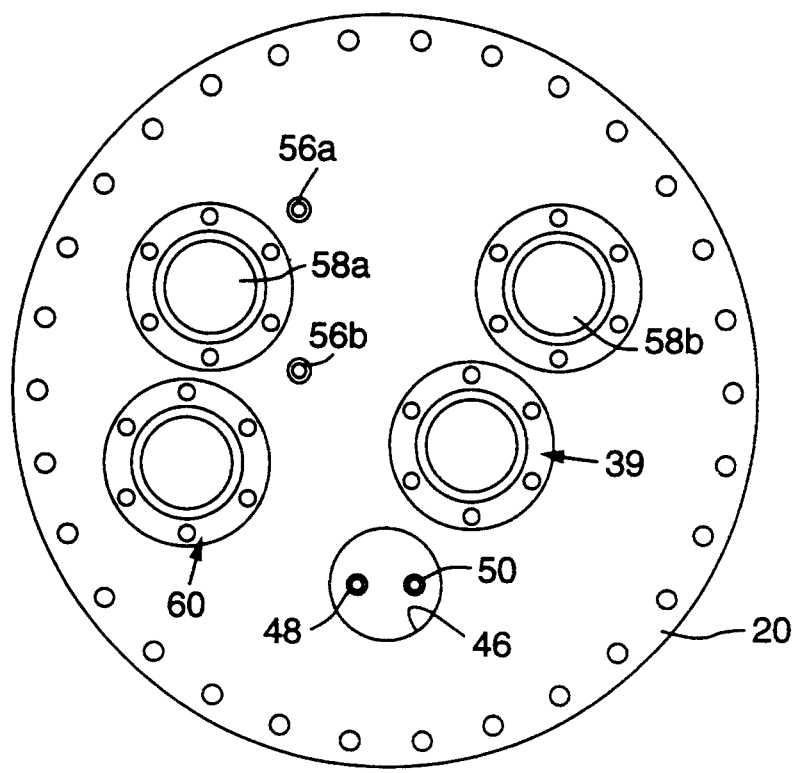
FIGS. 3 and 4 are elevational views of the structure shown in FIG. 2 taken along lines 3—3 and 4—4, respectively.
Figure 4:
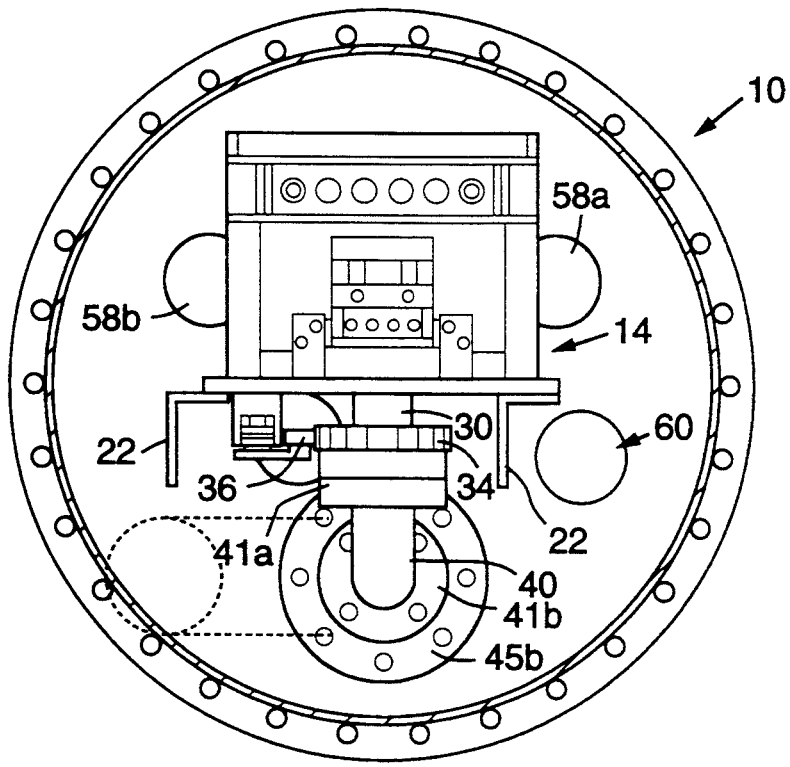

FIGS. 3 and 4 show the other typical water cooling connections 56a and 56b, high voltage connections 58a and 58b and the magnet coil connection 60 to the E-gun assembly.

Figure 5A:
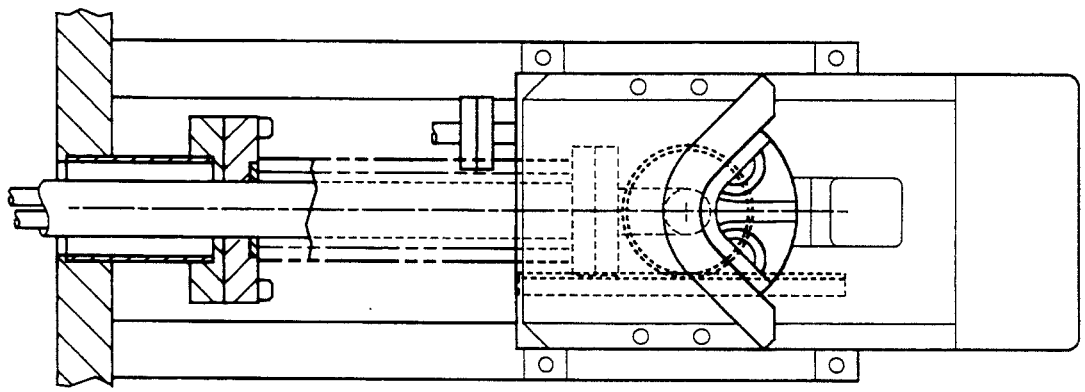
FIGS. 5A, 5B and 5C are views similar to FIG. 1 showing various positions of the E-gun assembly upon rotation of the crucible support structure.
Figure 5B:
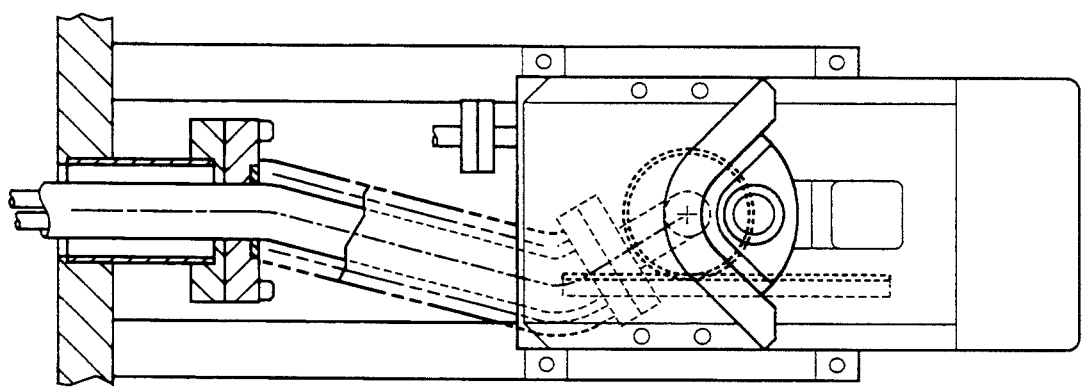
Figure 5C:
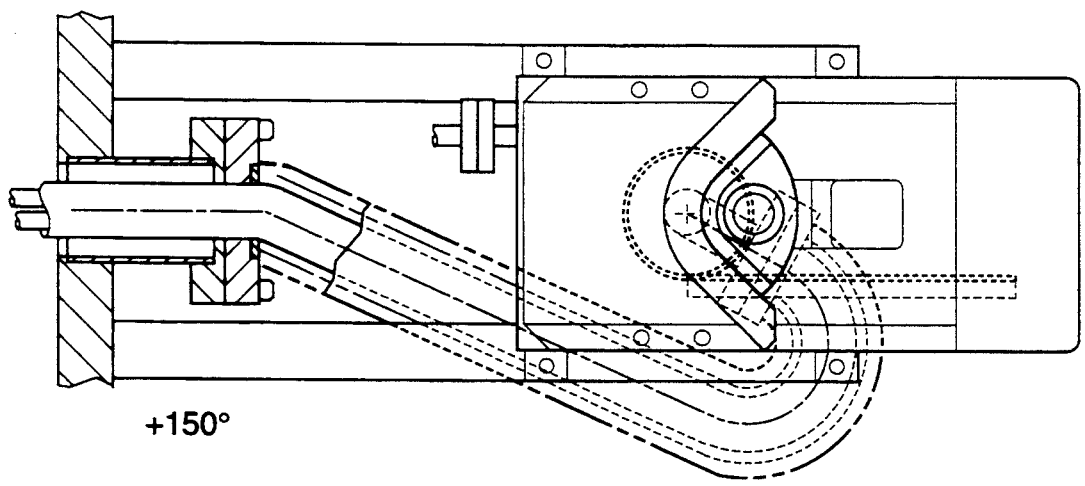

FIGS. 5A, 5B and 5C illustrate different positions of the elbow connection 40 and elongate housing 42 as the six pocket crucible 18 is rotated to position different crucible pockets at the E-beam target over half the drive length of the rack 36 and pinion 34. FIG. 5A shows the axis of the elongate housing 42 aligned with the axis of the elbow connection 40 (i.e., a 0° angle). FIGS. 5B and 5C show these axes at 30° and 150° angles, respectively.

By way of illustration for the preferred embodiment of this invention, a stainless steel bellows 44 having an inside diameter of 0.865" and an outside diameter of 1.56" and with 170 convolutions is welded to connecting flanges 45A and 45B, approximately 0.625" thick, and provides an elongate housing 42 6.84" in length in the position when in FIG. 5A and 13.91" in extended length in the position shown in FIG. 5C. The bellows 44 is heat treated so it will contract at least to the length shown in FIG. 5A.

Although the present invention has been shown and described with respect to a preferred embodiment, various changes and modifications which are obvious to a person skilled in the art to which the invention pertains are deemed to lie within the spirit and scope of the invention.

The terms and expressions which have been employed here are used as terms of description and not of limitation, and there is no intention, in the use of such terms and expressions, of excluding equivalence of the features shown and described, or portions thereof, it being recognized that various modifications are possible within the scope of the invention claimed.

What is claimed is:

1. An electron beam gun assembly comprising, in combination;
   a crucible, means for rotating said crucible about an axis, an elongate housing means extending at an angle to said axis; and
   inlet and outlet flexible crucible cooling tubes passing through said housing means and connected to said crucible support structure for passing cooling fluid to cool said crucible;
   said housing including an elongate metallic bellows which varies in length as said crucible rotates.

2. The electron beam gun assembly of claim 1 wherein said metallic bellows collapses to a minimum length for each position of said crucible structure as said crucible is rotated.

3. The electron beam gun assembly of claim 1 wherein said inlet and outlet flexible crucible cooling tubes are non-metallic.

4. An electron beam gun assembly comprising, in combination,
   a crucible having a crucible support structure,
   means for rotating said crucible and said crucible support structure about an axis;
   first housing means position on said axis;
   an elongate second housing means extending at an angle to and fixedly connected to said first housing means; and
   inlet and outlet flexible crucible cooling tubes passing through said first and second housing means and connected to said crucible support structure for passing cooling fluid to cool said crucible;
   said second housing means including an elongate metallic bellows which varies in length as said crucible rotates.

5. The electron beam gun assembly of claim 4 wherein said metallic bellows collapses to the minimum length for each position of said crucible structure as said crucible is rotated.

6. The electron beam gun assembly of claim 4 wherein said inlet and outlet flexible crucible cooling tubes are nonmetallic.

7. The electron beam gun assembly of claim 4 wherein the axis of said bellows in perpendicular to the rotational axis of said crucible.

8. An electron beam gun assembly comprising, in combination;
   a crucible housing having a crucible support structure;
   means for rotating said crucible and said crucible support structure about a substantially vertical axis;
   a first metallic housing means position on said vertical axis and fixedly connected to said crucible support structure;
   an elongate second metallic housing means extending at an angle to said axis and fixedly connected at one end thereof to said first housing means whereby said one end of said second housing is rotated around said vertical axis when said crucible is rotated; and
   inlet and outlet flexible non-metallic crucible cooling tubes passing through said first and second housing means and connected to said crucible support structure for passing cooling liquid to and from said crucible to cool said crucible;
   said second housing including an elongate metallic bellows which varies in length as said crucible rotates and said bellows collapses to the minimum length for each position of said crucible structure as said crucible is rotated.

9. The electron beam gun assembly of the claim 8 wherein the axis of said bellows is substantially horizontal.

* * * * *